United States Patent
Giambartino et al.

(10) Patent No.: US 8,254,194 B2
(45) Date of Patent: Aug. 28, 2012

(54) SENSE AMPLIFIER WITH REDUCED AREA OCCUPATION FOR SEMICONDUCTOR MEMORIES

(75) Inventors: Antonio Giambartino, Palermo (IT); Michele La Placa, Cefalu (IT); Ignazio Martines, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/911,575

(22) Filed: Oct. 25, 2010

(65) Prior Publication Data

US 2011/0110169 A1   May 12, 2011

Related U.S. Application Data

(62) Division of application No. 11/713,067, filed on Feb. 28, 2007, now Pat. No. 7,843,738.

(30) Foreign Application Priority Data

Feb. 28, 2006 (IT) .............................. MI2006A0350

(51) Int. Cl.
   *G11C 7/02* (2006.01)
(52) U.S. Cl. .................... 365/207; 365/185.21; 365/196
(58) Field of Classification Search .................. 365/207, 365/185.21, 196
   See application file for complete search history.

(56) References Cited

U.S. PATENT DOCUMENTS

| 6,625,057 B2 | 9/2003 | Iwata | |
| 2003/0076148 A1* | 4/2003 | Tamiya et al. | 327/308 |
| 2003/0189847 A1* | 10/2003 | Liu et al. | 365/200 |
| 2004/0228161 A1 | 11/2004 | Mori et al. | |
| 2005/0030809 A1* | 2/2005 | Vimercati et al. | 365/222 |
| 2005/0063236 A1 | 3/2005 | Pagliato et al. | |
| 2006/0062042 A1 | 3/2006 | Karlsson et al. | |
| 2009/0154249 A1* | 6/2009 | Pasotti et al. | 365/185.21 |

FOREIGN PATENT DOCUMENTS

| EP | 1467377 | 10/2004 |
| EP | 1505605 | 2/2005 |

* cited by examiner

*Primary Examiner* — Vu Le
*Assistant Examiner* — Han Yang
(74) *Attorney, Agent, or Firm* — Graybeal Jackson LLP (57) ABSTRACT

A reading circuit for a semiconductor memory, comprising: a circuital branch adapted to be electrically coupled to a bit line which is connected to a memory cell to be read; an evaluation circuit adapted to sense a cell electric current flowing through the bit line during a sensing phase of a reading operation of the data stored into the memory cell, the evaluation circuit comprising a negative feedback control loop adapted to control the potential of the bit line during the sensing phase, the control loop comprising a differential amplifier having an inverting input terminal operatively connected to the bit line, a non-inverting input terminal fed by a first reference potential, and a feedback circuital path connected between an output of the differential amplifier and the inverting input, wherein the feedback circuital path is adapted to conduct a measure current corresponding to the cell electric current, and comprises current/voltage conversion means for converting the measure current into a corresponding voltage. The conversion means of the feedback circuital path comprises at least one first transistor arranged to conduct the measure current, and biasing means adapted to bias the at least one first transistor so as to emulate the behavior of a resistor.

14 Claims, 3 Drawing Sheets

SENSE AMPLIFIER WITH REDUCED AREA OCCUPATION FOR SEMICONDUCTOR MEMORIES

PRIORITY CLAIM

The present application is a Divisional of U.S. patent application Ser. No. 11/713,067, filed on Feb. 28, 2007, now U.S. Pat. No. 7,843,738, issued Nov. 30, 2010; which application claims the benefit of Italian Patent Application Serial No. MI2006A000350, filed Feb. 28, 2006; all of the foregoing applications are incorporated herein by reference in their entireties.

TECHNICAL FIELD

An embodiment of the present disclosure relates to the field of semiconductor memories. More specifically, an embodiment of the present disclosure relates to the operation of reading semiconductor memories.

BACKGROUND

Semiconductor memories are commonly used in several applications for storing information, temporarily, in the so-called volatile memories, or permanently, in the so-called non-volatile memories, which are able to preserve the information also in absence of power supply. Typically, a non-volatile semiconductor memory comprises a matrix of memory cells, for example, floating-gate MOSFETs; each memory cell has a threshold voltage which is programmed to different levels, to which respective logic values correspond.

A very common type of memory is the so-called flash memory, which, in addition to the non-volatility, offers the possibility of electrically writing and erasing the memory cells.

For example, in the bi-level flash memories, wherein each cell is adapted to store only one information bit, in an erased condition the generic memory cell has a relatively low threshold voltage (the logic value 1 is typically associated thereto); the cell is programmed by the injection of electrons into the floating gate thereof: in such a condition the memory cell has a higher threshold voltage (the logic value 0 is typically associated thereto). In multi-level flash memories, each memory cell is adapted to store more than one information bit, and it can be programmed at a selected one of a plurality of different states, to which respective values of the threshold voltage correspond. For example, in a memory which operates with four levels (a so-called four-level memory), each memory cell stores a logic value which includes two information bits (that is, 11, 10, 01 and 00, as the threshold voltage of the memory cell increases).

For retrieving the stored information, the semiconductor memories comprise reading circuitries adapted to read the data stored in the memory cells.

In particular, the logic values stored in the selected memory cells are read by comparing a current flowing through each memory cell with the currents provided by one or more reference cells, programmed in a condition.

For this purpose, the reading circuitry also applies a suitable biasing voltage to the selected memory cells and the reference cells.

The comparison operation between the currents flowing respectively through the selected memory cell and the reference cells is typically performed by sense amplifiers, included in the reading circuitry and adapted to provide an indication of the stored logic value depending on the output voltage thereof.

A sense amplifier used in semiconductor memories is disclosed in the European patent application No. 03017939.4, which is incorporated by reference. Such a sense amplifier uses a negative feedback control loop in order to control and stabilize the voltage of an access line to the selected memory cell during the reading operations. In particular, two differential amplifiers are provided, the first amplifier being inserted in a negative feedback loop by means of a resistor which is coupled between the inverting input terminal and the output terminal thereof, while the second amplifier is adapted to sense the voltage variation across the resistor and, based on the sensed voltage variations, to provide an indication of the data stored in the selected memory cell.

It has been observed that such structure, advantageous under many viewpoints, has however the drawback that the resistor occupies a significant area of the semiconductor material chip wherein the sense amplifier is integrated.

The problem may become larger as the number of sense amplifiers which have to be integrated in the memory increases. For example, in the case of flash memories, wherein distinct individually-erasable memory sectors are often provided for, for each partition (or set) of sectors (for example, 16 memory sectors) a plurality of sense amplifiers is provided. In general, as the memory partitioning into sets of memory cells to be read concurrently increases, the number of sense amplifiers increases, and thus the area of the semiconductor chip dedicated to sense amplifiers becomes substantial.

In other words, the occupation of semiconductor area by the reading circuitry is more and more a limiting aspect in semiconductor memories which require a high number of sense amplifiers during the reading operations, contrasting the desire to increasingly minimize the memory-area-to-data-storage-capacity ratio.

Moreover, the resistor integrated in the sense amplifier of the above-mentioned patent application may have a high sensitivity to temperature variations (that is, as the temperature varies, the value of its resistance varies significantly) and this can make the read data uncertain.

SUMMARY

An embodiment of the present disclosure proposes a solution which is based on the idea of replacing the resistor to reduce the integrated circuit area occupied by the sense amplifier, and thus the size of the memory, and to improve the reliability of the sense amplifier.

In particular, an embodiment of the present disclosure proposes a reading circuit for a semiconductor memory, comprising: a circuital branch adapted to be electrically coupled to a bit line, said bit line being coupled to a memory cell to be read; an evaluation circuit adapted to sense a cell electric current flowing through the bit line during a sensing phase of a reading operation of the data stored in the memory cell. The evaluation circuit comprises a negative feedback control loop adapted to control the potential of the bit line during the sensing phase. The control loop comprises a differential amplifier having an inverting input operatively coupled to the bit line, a non-inverting input fed with a first reference potential and a feedback circuital path coupled between an output of the differential amplifier and said inverting input. The feedback circuital path is adapted to be run through by a measure current corresponding to said cell electric current, and comprises current/voltage conversion means for converting said measure current into a corresponding voltage. The conversion means of the feedback circuital path comprises at least one transistor arranged so as to be run through by said measure current, and biasing means adapted to bias said at least one first transistor so as to emulate the behavior of a resistor.

BRIEF DESCRIPTION OF THE DRAWINGS

Features and advantages of one or more embodiments will be made apparent by the following detailed description, provided merely by way of non-limitative example, read with the attached drawings.

DETAILED DESCRIPTION

Figure 1:
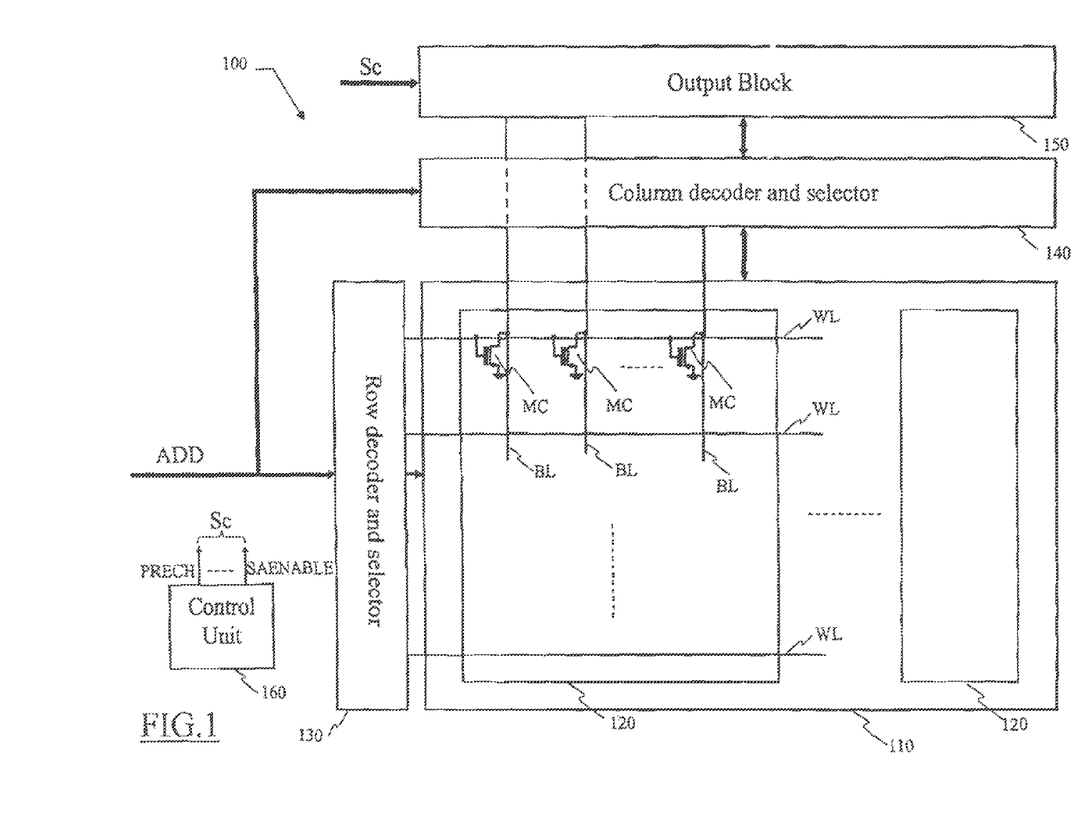
FIG. 1 shows a schematic block diagram of a memory device according to an embodiment.

With referring to FIG. 1, a semiconductor memory device 100 is shown, particularly a non-volatile memory of flash type. The memory device 100 comprises a matrix of flash memory cells MC, typically formed by floating gate MOSFETs; the matrix 110 is subdivided in various sectors 120 (for example, 32 sectors), each of which is individually erasable. Each memory sector 120 comprises a bi-dimensional arrangement of flash memory cells MC, arranged by rows of memory cells and columns of memory cells (shortly referred to as rows and columns in the following).

In particular, the memory cells of a same column are coupled to a bit line BL, whereas the cells of a same row are coupled to a word line WL.

In order to select the memory locations, the memory device 100 receives from outside an address code ADD. A portion of the address code ADD is provided to a row decoder and selector 130, and another portion of the address code ADD is provided to a column decoder and selector 140.

The column decoder and selector 140 interfaces the matrix of cells 110 with an output block 150, which is intended to include all the components (such as the sense amplifier and the data output interface circuits—so-called output buffers) which are necessary for reading the data stored in the matrix of flash memory cells MC, and the transmission thereof to the output of the memory device.

For example, during a reading operation, depending on the received address code ADD, the row decoder and selector 130 and the column decoder and selector 140 select respectively a word line WL and one or more bit lines BL (for example, a word line and eight or sixteen bit lines, for reading at the same time eight or sixteen memory cells MC).

By means of the row decoder and selector 130 and the column decoder and selector 140, a set of memory cells MC (for example, sixteen) which stores a word (16 bit in the example at issue) can be electrically coupled to the output block 150. In particular, the column decoder and selector 140 allows coupling each selected bit line BL to a corresponding sense amplifier included in the output block 150. The remaining bit lines are instead left floating, or alternatively they are grounded. The row decoder and selector 130 biases each selected word line WL to a suitable reading voltage, while the remaining word lines WL are for example kept grounded.

Moreover, the memory device 100 comprises a control unit 160 which generates control signals (denoted as a whole as Sc) which, by means of corresponding control signal lines, are used for driving the various components (such as the sense amplifiers) during the operation of the memory device (for example during a reading operation). For example, the control signals Sc comprise a precharge signal PRECH and an enabling signal SAENABLE adapted to control the operation of the memory device 100 during a reading operation of the selected memory cells MC.

Figure 2:
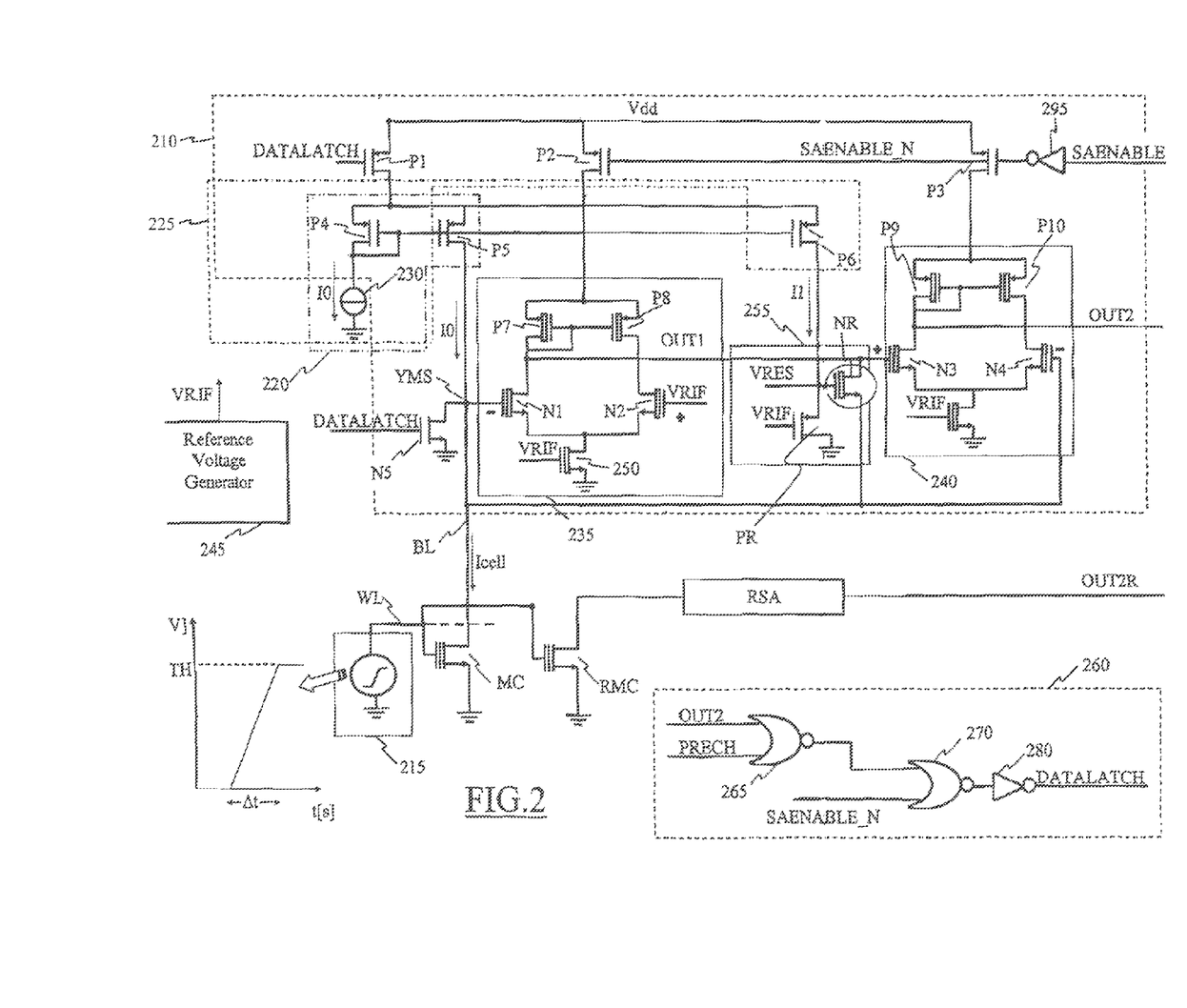
FIG. 2 shows a circuital scheme of a reading circuitry according to an embodiment.

With referring to FIG. 2, an exemplary scheme of a portion of the output block 150 is shown, limitedly to some blocks relevant for the understanding of an embodiment. In particular, a sense amplifier 210 adapted to read the data (logic value) stored in the selected memory cell MC is depicted. The example shown and described refers to a so-called "voltage ramp" reading technique, described for example in the already cited European patent application No. 03017939.4 and in the European patent application publication No. EP 1467377, which are incorporated by reference.

For this purpose, the word line WL of the selected memory cell MC is coupled to a voltage generator block 215 adapted to bias it to a suitable reading voltage Vg which, in case of voltage ramp reading, varies in time, particularly it follows a monotonically increasing trend, for example a linearly increasing trend, for example a voltage ramp. During a reading operation, the reading voltage Vg, starting from a very low or substantially zero value (for example, equal to the ground), reaches a final value VgTH in a predetermined time Δt (for example, equal to 10 ns). For example, in case the selected memory cell MC stores more than one information bit, for example two information bits, the value of the threshold voltage VgTH is such as to reach the highest threshold voltage of the memory cells MC (corresponding by convention to the logic state 00) when they are programmed.

The reading voltage Vg is also applied to one (or more) reference cells, only one of which is shown for simplicity, and it is denoted RMC. For increasing reading voltages Vg, the selected memory cell MC and the reference cell(s) turns on, and start conducting current, at different times, depending on the respective programming state (that is, as soon as the reading voltage reaches the threshold voltage thereof). The currents flowing through the cells are compared by means of corresponding sense amplifiers (in the example at issue, a sense amplifier RSA corresponds to the reference cell RMC) and the timing according to which the selected memory cell MC turns on compared to instants at which the reference cells turn on uniquely identifies the logic value stored in the cell MC.

The sense amplifier 210 comprises an enable/disenable circuitry comprising, in the example considered, three p-channel MOSFETs P1, P2 and P3, the source terminals of which are coupled to a common voltage supply line, from which they receive a supply voltage Vdd (for example, 1.8 V). The gate terminals of the transistors P2 and P3 are coupled (for example, by means of an inverter 295) to a control signal line from which they receive a signal SAENABLE_N which is the logic complement of the enabling signal SAENABLE, whereas the gate terminal of the transistor P1 is coupled to an activation signal line and receives an activation signal DATA-LATCH.

The sense amplifier 210 also comprises two current generator circuits 220 and 225 coupled to the drain terminal of the transistor P1. In the example at issue, the two current generator circuits 220 and 225 respectively comprise pairs of p-channel MOS transistors P4, P5 and P4, P6 coupled in a current-mirror circuital configuration. In particular, the transistors P4 and P5 have the source terminal coupled to the drain terminal of the transistor P1 and the gate terminals coupled together and further coupled to the drain terminal of the transistor P4, which is thus coupled as a diode. Moreover, the drain terminal of the transistor P4 is coupled to a current generator 230, which generates a current I0. Similarly, the transistor P6 of the current generator circuit 225 is coupled to the transistor P4 in a current-mirror configuration similar to that of the transistors P4 and P5. The drain terminal of the transistor P5 is coupled (for example, by means of one or more bit line select transistors, not-shown in the drawings, which belong to the column decoder and selector 140) to the bit line BL of the selected memory cell MC.

The drain terminal of the transistor P2 is coupled to a first differential amplifier 235, whereas the drain terminal of the transistor P3 is coupled to a second differential amplifier 240.

The first differential amplifier 235 and the second differential amplifier 240 are amplifiers with a relatively high gain, and each has an inverting input terminal (denoted in FIG. 2 with the symbol "−") and a non-inverting input terminal (denoted in FIG. 2 with the symbol "+").

The inverting terminal of the amplifier 235 is coupled to the drain terminal of the transistor P5, and thus, in operation, it is coupled to the selected bit line BL; the non-inverting terminal of the amplifier 235 receives a reference voltage VRIF (for example, comprised in a voltage range from 0.5V to 1V) provided by a reference voltage generation circuital block 245. An output terminal of the differential amplifier 235 provides a first output voltage signal OUT1 and is coupled to a non-inverting input terminal of the differential amplifier 240. The inverting input terminal of the differential amplifier 240 is instead coupled to the drain terminal of the transistor P5, so as to receive a same voltage signal YMS as the inverting input terminal of the amplifier 235.

A switch is also coupled to the drain terminal of the transistor P5, the switch adapted to bring the terminal to ground; for example, an n-channel transistor N5 has the drain terminal coupled to the drain terminal of the transistor P5, the source terminal coupled to the ground and the gate terminal coupled to the activation line DATALATCH.

The differential amplifier 235 comprises a pair of input n-channel MOSFETs N1 and N2 respectively coupled to a pair of load p-channel MOSFETs P7 and P8 coupled in a current-mirror configuration. In particular, the gate terminals of the transistors N1 and N2 are respectively coupled to the inverting and the non-inverting input of the differential amplifier 235, whereas the drain terminals are respectively coupled to the drain terminals of the transistors P7 and P8. The source terminals of the transistors P7 and P8 are instead coupled to the drain terminal of the transistor P2. A current generator 250, for example comprising an n-channel MOSFET with source at ground, is coupled to the source terminals of the input transistors N1 and N2.

The differential amplifier 240 comprises MOSFETs N3, N4, P9 and P10, and it has a structure similar to that of the differential amplifier 235; for this reason it is not described in detail.

According to an embodiment, the MOSFETs of the differential amplifiers 235 and 240 are of the so-called "native" type (that is, they are MOSFETs having a low threshold voltage, which is determined only by the level of dopants of the semiconductor well wherein the MOSFET is formed, without any additional dopant implant for modifying the threshold voltage value). The native MOSFETs, due to their low threshold voltage, have the advantage of being able to conduct current also with low supply voltages, thus reducing the power dissipated during the device operation.

The differential amplifier 240 has an output terminal which is coupled to the drain terminal of the n-channel input transistor N3 of the non-inverting input terminal. The output terminal provides a second output voltage signal OUT2, which, differently from the first output voltage signal OUT1, is a digital signal, the logic level of which is adapted to provide an indication of the data stored in the selected memory cell MC.

The drain terminal of the transistor P6 is coupled to a feedback block 255. The feedback block 255 comprises a p-channel MOSFET PR and an n-channel MOSFET NR. The transistor NR is a native transistor having a relatively low threshold voltage VTHn (for example, 0.15V) whereas the transistor PR has a higher threshold voltage VTHp (for example, 0.6V). The transistor PR has the source terminal coupled to the drain terminal of the transistor P6, whereas the drain terminal is kept at ground. The gate terminal of the transistor PR receives the reference voltage VRIF. The transistor NR has the drain terminal coupled to the non-inverting input terminal of the differential amplifier 240, the source terminal coupled to the inverting input terminal of the amplifier 235 and the gate terminal coupled to the source terminal of the transistor PR.

The feedback block 255 is coupled to the differential amplifier 235 in such a way to form a negative feedback circuital loop (as disclosed in more detail in the following).

In FIG. 2 a combinatory logic circuit is shown, forming a control circuitry 260 adapted for generating the activation signal DATALATCH, in response to the signals PRECH, SAENABLE and OUT2. In detail, the control circuitry 260 comprises a first NOR logic gate 265 coupled to a second NOR logic gate 270. In particular, the NOR logic gate 265 has two input terminals which receive respectively the second output voltage signal OUT2 and the control signal PRECH, and has the output terminal coupled to one of two inputs of the NOR logic gate 270. The control signal line which brings the logic complement signal SENABLE_N of the enabling signal SAENABLE is coupled to the remaining input of the logic gate 270. The output terminal of the logic gate 270 is coupled to the input terminal of an inverter 280 which in output drives the activation signal line DATALATCH.

A reading operation of the selected memory cell MC is performed in two different phases: a precharging phase of the selected bit line BL, and a reading phase of the data stored in the addressed memory cell MC.

Figure 3:
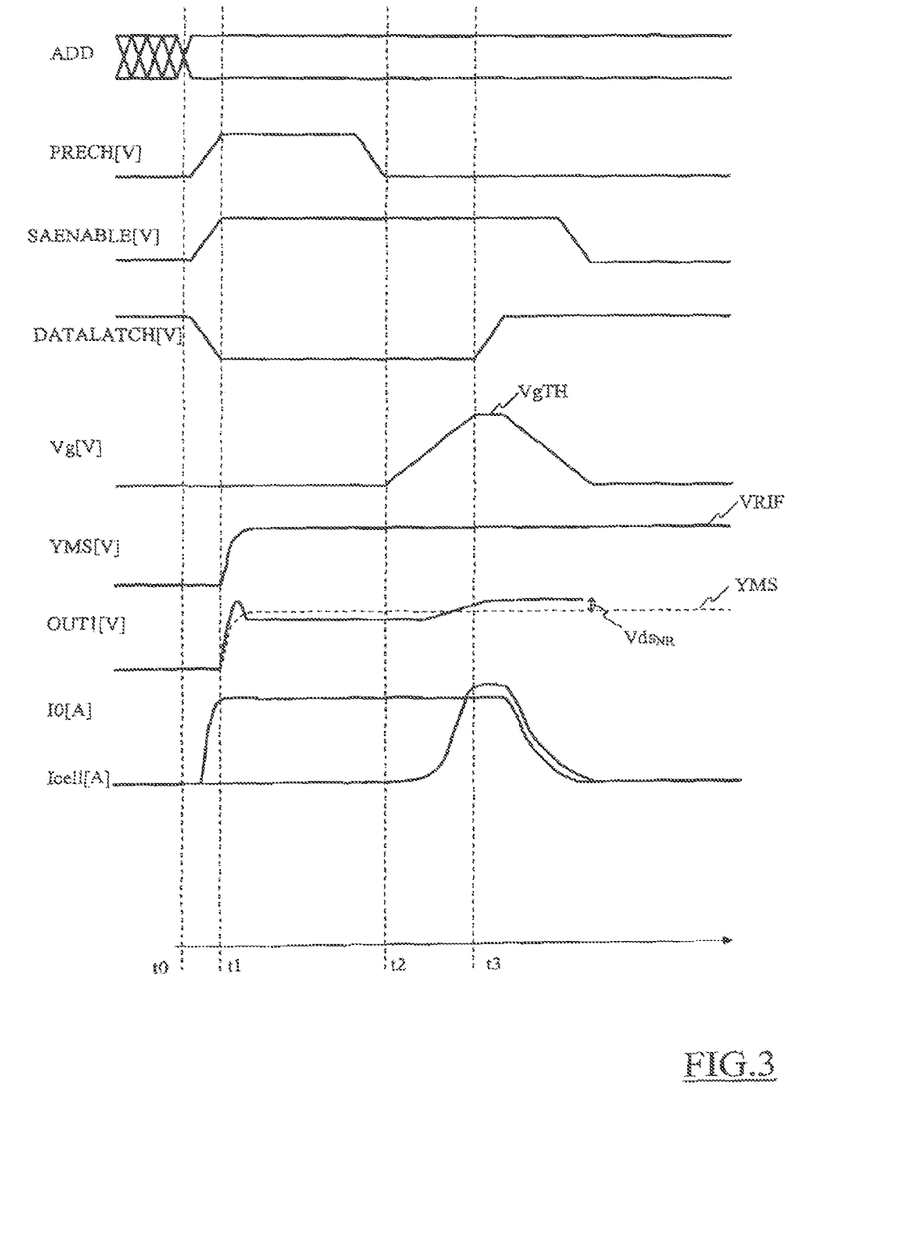
FIG. 3 schematically shows timing diagrams explaining the operation of the reading circuitry shown in FIG. 2, according to an embodiment.

With reference to FIGS. 2 and 3, let it be assumed that, at a generic instant t0, the address code ADD is received by the memory device, and that such address code ADD identifies (through the respective word line WL and the respective bit line BL) the memory cell MC shown in FIG. 2. The row decoder and selector 130 selects the word line WL to which the memory cell MC belongs by electrically coupling it to the voltage generator block 215, whereas the column decoder and selector 140 selects the bit line BL to which the memory cell MC belongs, by electrically coupling it (through the select transistors not shown in the drawing) to the sense amplifier 210.

Thereafter, at an instant t/, the precharging phase starts, in which the control unit 160 asserts the precharging signal PRECH and the enabling signal SAENABLE, bringing them to a high voltage level (that is, the supply voltage Vdd).

In response to the assertion of the precharging signal PRECH and the enabling signal SAENABLE, the control circuitry 260 deasserts (bringing it to the logic value 0, typically, the ground) the activation signal DATALATCH. The activation signal DATALATCH turns the transistor P1 on. Indeed, when the precharging signal PRECH is at the high logic level, regardless of the voltage taken by the second output voltage signal line OUT2, the output of the logic gate 265 reaches the low logic level. In turn, the output of the logic gate 270 is brought to the high logic level. In such a way, the activation signal DATALATCH is brought to the low logic level, that is, it is deasserted.

In such biasing conditions, the transistor N5 is off, and is not able to conduct current. The transistors P1, P2 and P3 are instead on, and their drain terminals are brought to a voltage value approximately equal to the supply voltage Vdd.

During the device operation, the current generator circuits 220 and 225 deliver two currents I0 and I1 (for example, having a value ranging from 6 μA to 10 μA).

In the example at issue, the current I0 is delivered by the transistor P5 starting from the current generated by the current generator 230, by mirroring. In particular, the transistors P5 and P4 have a size such that the mirroring ratio is approximately equal to 1, in such a way that the current I0 delivered by the transistor P5 has a value equal to the current provided by the current generator 230. Instead, the current I1 is provided by the transistor P6, always starting from the current generated by the current generator 230, by mirroring. Similarly to the transistors P5 and P4, also the transistors of the pair of transistors P6 and P4 have size such that the mirroring ratio is approximately equal to 1, so that the current I1 delivered by the transistor P6 is equal to the current provided by the current generator 230. Thus, in the example at issue, the currents I0 and I1 are approximately equal. Nothing prevents one, in an alternative embodiment, from designing the transistors P4, P5 and/or P6 so that the currents I0 and I1 have a value different from the current generated by the generator 230, and/or different from each other.

During the precharging phase, the reading voltage Vg takes a substantially zero value. In such a way, the selected memory cell MC is turned off, not being able to conduct any current, and the current I0, delivered by the transistor P5, flows in the circuital feedback branch and runs through the feedback block 255. Also the current I1 delivered by the transistor P6 flows through the feedback block 255. In particular, the current I0 flows through the transistor NR (and then it continues entering into the output terminal of the differential amplifier 235), whereas the current I1 flows through the transistor PR, and discharges to ground.

In this way, in the circuital loop formed by the differential amplifier 235 and the feedback block 255, a negative feedback is established, so that the voltage YMS (and thus the voltage of the bit line BL of the selected memory cell MC) reaches approximately the value of the reference voltage VRIF. In other words, as known in the art the inverting input of the differential amplifier 235 acts as a "virtual ground"; the higher the gain of the differential amplifier 235, the closer the voltage YMS to the voltage of the non-inverting terminal of the differential amplifier 235, and thus to the reference voltage VRIF.

After a time (for example, 15 ns) sufficiently long for ensuring the complete precharge of the bit line BL, at an instant t2 the control unit 160 deasserts the precharge signal PRECH, bringing its to the low logic level (that is, to ground). Thus, the precharging phase ends, and the reading phase of the data stored in the selected memory cell MC starts.

From the instant t2, the reading voltage Vg, starting from a very low value, approximately zero, increases, for example linearly, reaching the value VgTH at the instant t3. In particular, considering for simplicity and merely by way of example the case wherein the selected memory cell MC is programmed (meaning that the memory cell MC has a relatively high threshold voltage, for example equal to the value VgTH), until the reading voltage Vg reaches the threshold voltage VgTH of the cell, no current flows through the memory cell MC.

In such a way, the current I0 continues to flow (like in the precharging phase) through the feedback branch and the feedback block 255, and the second output voltage signal OUT2 remains at the voltage level at which it was brought during the previous precharging phase (that is, to a value approximately equal to Vdd). At the instant t3, the reading voltage Vg reaches the value of the threshold voltage VgTH of the memory cell MC, thereby turning the cell on, which can conduct a current Icell.

Also during the reading phase, the negative feedback established by the feedback loop formed by the differential amplifier 235 and the feedback block 255 keeps the value of the voltage YMS substantially at the reference voltage VRIF (indeed, the inverting input of the differential amplifier 235 acts always as "virtual ground").

As it can be appreciated, the transistor NR of the feedback block 255 operates in the triode zone (that is, it does not enter saturation, remaining in the zone of the respective transfer characteristic which has a substantially linear pattern) acting as a feedback resistor. The transistor PR is adapted to provide a suitable shifted voltage VRES to the gate terminal of the transistor NR, in order to maintain the latter biased in the triode zone. In particular, the transistor PR is turned on and the shifted voltage VRES consequently is higher than the reference voltage VRIF of an amount at least equal to the value of the threshold voltage of the transistor PR. For example, the shifted voltage can be approximately equal to 1.2 V.

The fact that the transistor NR operates in the triode zone can be explained as follows: if such transistor were to operate in the saturation zone (the zone of the transfer characteristic in which the current is substantially constant irrespective of changes of the drain-to-source voltage), the voltage $Vds_{NR}$ between the transistor drain terminal and source terminal would be higher or at most equal to the voltage drop between the gate terminal and the source terminal thereof, reduced by an amount equal to the transistor threshold voltage. In particular, the value of the voltage at the gate terminal of the transistor NR is at least equal to the reference voltage VRIF shifted by a value equal to the threshold voltage of the transistor PR, whereas the source voltage of the transistor NR is kept at the value of the reference voltage VRIF by means of the feedback loop comprising the differential amplifier 235 and the feedback block 255. Thus, should the transistor NR operate in saturation zone, the voltage between the drain terminal and source terminal thereof would follow the following relation:

$$Vds_{NR} = VTHp - VTHn \quad (1)$$

wherein VTHp and VTHn are respectively the threshold voltages of the transistors PR and NR.

In the example at issue, it would result that:

$$Vds_{NR} = 0.6V - 0.15V = 450\text{ mV} = Vds_{NR} \quad (2)$$

Simulations of the circuit shown in FIG. 2 have pointed out that, as shown in FIG. 3, during the reading operation of the selected memory cell MC, the voltage $Vds_{NR}$ has a value much lower: the variation of the first output voltage signal OUT1 with respect to the reference voltage VRIF is of the order of ±100 mV, thus the voltage $Vds_{NR}$ is of the order of 100 mV, much lower than the voltage value $Vds_{NR}$ which it should take for the transistor NR entering in saturation. It follows that the transistor NR operates in the triode zone, and acts substantially as a resistor, from the electrical viewpoint.

In other words, the reading of the data stored in the memory cell MC is performed using a transistor NR operating in triode zone.

When the current Icell of the selected memory cell MC has a value higher than that of the current I0 (as shown FIG. 3), a current contribution comes from the feedback block 255. In other words, the feedback branch provides the necessary current for supplying the difference between the current Icell of the memory cell MC and the current I0 provided by the transistor P5. In this way, the first output voltage signal OUT1 is brought to a voltage value higher than the voltage value taken by the voltage YMS (that is approximately equal to VRIF), and such voltage is applied to the non-inverting input terminal of the differential amplifier 240, thereby the voltage of the second output voltage signal OUT2 is brought from the high voltage level (approximately equal to Vdd) to the low voltage level (ground).

The differential amplifier 240 is thus adapted to sense and amplify the variation of voltage across the transistor NR due to the turning on of the selected memory cell MC. In particular, the differential amplifier 240 is sensitive to voltage variations of the order of the excursion of the first output voltage signal OUT1 with respect to the reference voltage VRIF.

Moreover, the differential amplifier 240 transforms such voltage variation in a full-swing digital signal—the switching instant thereof from the high level (the supply voltage Vdd) to the low value (ground) provides an indication of the data stored in the memory cell MC (by comparison of the instant at which the second output voltage signal OUT2 related to the selected cell switches and the instant at which a similar signal OUT2R related to the reference cell RMC switches). In greater detail, the reading voltage Vg is also applied to one (or more, depending for example on the fact that the cell is bi-level or multi-level) reference cell, and in particular to the reference memory cell RMC. Considering, merely by way of example, the case wherein the memory cell MC is programmed, and thus has a threshold voltage VgTH higher than that of the reference cell RMC, no current flows through the reference memory cell RMC until the reading voltage Vg reaches the value of the threshold voltage thereof. When the reading voltage Vg is such as to turn the reference cell RMC on, the corresponding sense amplifier RSA brings the second reference output voltage signal OUT2R (which is similar to the second output voltage signal OUT2) to the low voltage level (ground). The switching occurs at an instant before the instant t3 at which the second output voltage signal OUT2 switches, and the timing relation between the two switching instants (that is, between that related to the reference memory cell RMC and that related to the selected memory cell MC) indicates the logic value stored in the selected memory cell MC. In the example at issue, since the instant at which the reference cell RMC starts to conduct current precedes the instant t3 at which the memory cell MC starts to conduct, the cell MC is read as being in a programmed state.

As soon as the voltage of the second output voltage signal OUT2 is brought to the low voltage level (ground), the control circuitry 260 asserts the activation signal DATALATCH, bringing it to the high logic value (that is, the supply voltage Vdd). In such biasing conditions, the transistor P1 is turned off while the transistor N5 is turned on, bringing the voltage of the bit line BL of the selected memory cell MC, and thus the voltage YMS, to ground. In such a way, the sense amplifier 210 is disabled and ready for a subsequent reading operation.

Vice versa, when the current Ice is lower than or equal to the current I0, the current in excess flows into the feedback branch 255, and the voltage of the first output voltage signal OUT1 remains at a voltage value lower than the voltage value taken by the voltage YMS. In such conditions, the voltage of the second output voltage signal OUT2 is kept at the high level (that is, at a value approximately equal to the supply voltage Vdd).

The solution according to an embodiment significantly reduces the occupation of the integrated circuit area of the output block 150. Indeed, using the transistors PR and NR in substitution of integrated resistors significantly reduces the area occupied by the sense amplifier 210 in the semiconductor material chip.

This embodiment is particularly relevant in applications of the memory device in which the reading operations involve a high number of sense amplifiers. In other words, since thanks to the structure of the feedback block 255, the integration of the sense amplifier requires a relatively small semiconductor area, this solution is particularly advantageous in memory devices wherein the matrix of cells is divided in a number of partitions, each one comprising one or more sectors.

Moreover, the low threshold voltage of the native MOSFET NR causes the latter to operate in the triode zone, thus acting as a resistor placed between the inverting input of the differential amplifier 235 and the output terminal thereof.

In addition, the presence of the negative feedback both during the precharging phase and during the reading phase allows the bit line BL of the memory cell MC not to be left floating, but its voltage is always substantially maintained at the reference potential VRIF, and this reduces or eliminates regions of uncertainty during the operation of the sense amplifier 210.

Moreover, the resistance of the resistor formed by the transistor NR varies with the temperature in way less pronounced than a real integrated resistor. Indeed, from the previous relation (1), it should be noted that the voltage between the drain and source terminals of the transistor NR is almost completely invariant with regard to the temperature, since it depends on the difference between the threshold voltage of the transistors NR and PR.

Moreover, as it can be deduced from the relation (1), the value of the resistor is independent from the reference voltage VRIF, thus allowing setting the voltage value on the drain terminal of the selected memory cell MC in a way which is independent from the desired value for the resistor represented by the transistor NR.

Naturally, in order to satisfy local and specific requirements, a person skilled in the art may apply to the solution described above many modifications and alterations. Particularly, although the present disclosure has been described with a certain degree of detail with reference to one or more embodiments thereof, it should be understood that various omissions, substitutions and changes in the form and details as well as other embodiments are possible.

For example, similar considerations apply if the memory device has a different structure or comprises equivalent elements (for example, with multilevel memory cells).

Moreover, although described relating to a memory device in which the reading voltage used has a rising linear pattern, nothing prevents one from applying a solution according to an embodiment with reading voltages having a different pattern, or in the case of reading techniques different from the one with a gate voltage ramp.

Besides, it is possible to apply an embodiment also during verify program operations performed on the memory device.

Moreover, it is possible to apply an embodiment using current generators having a different structure from the described one or comprising bipolar transistors.

For example, similar considerations apply if the transistor is replaced by two or more transistors which are coupled in series and/or in parallel in order to emulate the resistor.

Besides, similar considerations apply if the current values are different from each other.

Moreover, the control circuitry can have a different structure or include equivalent logic gates.

The memory device 110 of FIG. 1 (and including one or more instances of the circuitry of FIG. 2) may compose part of a system, such as a computer system, and be coupled to another component such as a processor or controller.

From the foregoing it will be appreciated that, although specific embodiments have been described herein for purposes of illustration, various modifications may be made without deviating from the spirit and scope of the disclosure.

What is claimed is:

1. A reading circuit for a semiconductor memory, comprising:
   a circuital branch adapted to be electrically coupled to a bit line, said bit line being coupled to a memory cell to be read;
   an evaluation circuit adapted to sense a cell electric current flowing through the bit line during a sensing phase of a reading operation of the data stored in the memory cell, said evaluation circuit comprising a negative feedback control loop adapted to control the potential of the bit line during the sensing phase, said control loop comprising a differential amplifier having an inverting input operatively coupled to the bit line, a non-inverting input supplied from a first reference potential, and a feedback circuital path coupled between an output of the differential amplifier and said inverting input,
   wherein said feedback circuital path is adapted to conduct a measure current corresponding to said cell electric current, and comprises a current/voltage conversion circuit for converting said measure current into a corresponding voltage;
   wherein said conversion circuit of the feedback circuital path comprise at least one first transistor arranged so as to conduct said measure current, and biasing circuit configured to generate a non-logic signal adapted to bias said at least one first transistor so as to emulate the behavior of a resistor.

2. The reading circuit according to claim 1, wherein said negative feedback control loop is adapted to keep the voltage value of the bit line substantially stable at a potential, corresponding to said first reference potential.

3. The reading circuit according to claim 1, wherein the at least one first transistor has a low turn-on voltage.

4. The reading circuit according to claim 1, wherein said at least one first transistor is coupled between the output of the differential amplifier and the inverting input thereof.

5. The reading circuit according to claim 1, wherein the biasing circuit comprises a second transistor having a first terminal coupled to a control terminal of the at least one first transistor, a second terminal coupled to a second reference potential and a control terminal receiving the first reference potential.

6. A reading circuit for a semiconductor memory, comprising:
   a circuital branch adapted to be electrically coupled to a bit line, said bit line being coupled to a memory cell to be read;
   an evaluation circuit adapted to sense a cell electric current flowing through the bit line during a sensing phase of a reading operation of the data stored in the memory cell, said evaluation circuit comprising a negative feedback control loop adapted to control the potential of the bit line during the sensing phase, said control loop comprising a differential amplifier having an inverting input operatively coupled to the bit line, a non-inverting input supplied from a first reference potential, and a feedback circuital path coupled between an output of the differential amplifier and said inverting input,
   wherein said feedback circuital path is adapted to conduct a measure current corresponding to said cell electric current, and comprises current/voltage conversion circuit for converting said measure current into a corresponding voltage;
   wherein said conversion circuit of the feedback circuital path comprise at least one first transistor arranged so as to conduct said measure current, and biasing circuit adapted to bias said at least one first transistor so as to emulate the behavior of a resistor;
   the reading circuit further comprising a voltage comparator having a first and a second inputs respectively coupled to a first and a second terminal of the at least one first transistor, said voltage comparator being adapted to compare voltages of said first and second terminals of the at least one first transistor and to generate responsive thereto a full swing logic signal indicative of the data stored in the memory cell.

7. A method of reading a cell of a semiconductor memory, comprising the steps of:
   electrically coupling a circuital branch to a bit line, said bit line being coupled to a memory cell to be read;
   sensing a cell electric current flowing through the bit line during a sensing phase of a reading operation of the data stored in the memory cell with an evaluation circuit;
   controlling the bit line potential during the sensing phase with a negative feedback control loop comprised in the evaluation circuit, said control loop comprising a differential amplifier having an inverting input operatively coupled to the bit line, a non-inverting input fed with a first reference potential, and a feedback circuital path coupled between an output of the differential amplifier and said inverting input, wherein said feedback circuital path is adapted to conduct a measure current corresponding to said electric cell current;
   converting said measure current into a corresponding voltage;
   wherein said converting further comprises:
      providing at least one first transistor included in said conversion means of the feedback circuital path; and
      biasing said at least one first transistor with a non-logic signal so that it emulates the behavior of a resistor.

8. A method of reading a cell of a semiconductor memory, comprising the steps of:
   electrically coupling a circuital branch to a bit line, said bit line being coupled to a memory cell to be read;
   sensing a cell electric current flowing through the bit line during a sensing phase of a reading operation of the data stored in the memory cell with an evaluation circuit;
   controlling the bit line potential during the sensing phase by means of a negative feedback control loop comprised in the evaluation circuit, said control loop comprising a differential amplifier having an inverting input operatively coupled to the bit line, a non-inverting input fed with a first reference potential, and a feedback circuital path coupled between an output of the differential amplifier and said inverting input, wherein said feedback circuital path is adapted to conduct a measure current corresponding to said electric cell current;

converting said measure current into a corresponding voltage;
wherein said converting further comprises:
providing at least one first transistor included in said conversion means of the feedback circuital path; and
biasing said at least one first transistor so that it emulates the behavior of a resistor; and
wherein the biasing the at least one first transistor further comprises operating the at least one first transistor in a triode zone.

9. The method of claim 7 wherein the sensing a cell electric current further comprises comparing the cell electric current with a read-reference signal to determine the data stored in the memory cell.

10. The method of claim 7 wherein the sensing a cell electric current further comprises comparing a timing of the cell electric current with a timing of a read-reference signal to determine the data stored in the memory cell.

11. The method of claim 7, further comprising:
amplifying the cell electric current to generate a twice-amplified read signal; and
comparing the twice-amplified cell electric current with a read-reference signal to determine the data stored in the memory cell.

12. A system, comprising:
a controller; and
a memory coupled to the controller and comprising
a reading circuit for a semiconductor memory, comprising:
a circuital branch adapted to be electrically coupled to a bit line, said bit line being coupled to a memory cell to be read;
an evaluation circuit adapted to sense a cell electric current flowing through the bit line during a sensing phase of a reading operation of the data stored in the memory cell, said evaluation circuit comprising a negative feedback control loop adapted to control the potential of the bit line during the sensing phase, said control loop comprising a differential amplifier having an inverting input operatively connected to the bit line, a non-inverting input supplied from a first reference potential, and a feedback circuital path coupled between an output of the differential amplifier and said inverting input,
wherein said feedback circuital path is adapted to conduct a measure current corresponding to said cell electric current, and comprises a current/voltage conversion circuit for converting said measure current into a corresponding voltage;
wherein said conversion circuit of the feedback circuital path comprise at least one first transistor arranged so as to conduct said measure current, and a biasing circuit adapted to bias said at least one first transistor to operate in a triode zone so as to emulate the behavior of a resistor.

13. The system of claim 12 wherein the memory comprises a single integrated circuit die.

14. The system of claim 12 wherein the memory comprises multiple integrated circuit dies.

* * * * *